(12) United States Patent
Renau et al.

(10) Patent No.: US 7,170,067 B2
(45) Date of Patent: Jan. 30, 2007

(54) ION BEAM MEASUREMENT APPARATUS AND METHOD

(75) Inventors: Anthony Renau, W. Newbury, MA (US); Eric Hermanson, Georgetown, MA (US); Joseph C. Olson, Beverly, MA (US); Gordon Angel, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/093,930

(22) Filed: Mar. 30, 2005

(65) Prior Publication Data
US 2006/0192134 A1    Aug. 31, 2006

Related U.S. Application Data

(60) Provisional application No. 60/653,394, filed on Feb. 16, 2005.

(51) Int. Cl.
*H01J 49/00* (2006.01)
(52) U.S. Cl. ............... 250/397; 250/492.21; 324/71.3
(58) Field of Classification Search ..................... None
See application file for complete search history.

(56) References Cited

U.S. PATENT DOCUMENTS

| | | | | | |
|---|---|---|---|---|---|
| 5,113,074 | A | * | 5/1992 | Sferlazzo | .................. 250/492.2 |
| 5,457,324 | A | * | 10/1995 | Armour et al. | ........ 250/492.21 |
| 2001/0054686 | A1 | * | 12/2001 | Torti et al. | .................. 250/288 |

* cited by examiner

*Primary Examiner*—Jack Berman
*Assistant Examiner*—Zia R. Hashmi
(74) *Attorney, Agent, or Firm*—Varian Semiconductor Equipment Associates, Inc.

(57) ABSTRACT

The present invention provides a combined electrostatically suppressed Faraday and energy contamination monitor and related methods for its use. The apparatus of the present invention is capable of selectively measuring two properties of an ion beam, including, for example, a current and a level of energy contamination in a decelerated ion beam. A first aspect of the invention provides an ion beam measurement apparatus comprising an aperture for receiving the ion beam, a negatively biased electrode disposed adjacent to the aperture, a positively biased electrode disposed adjacent to the negatively biased electrode, a selectively biased electrode disposed adjacent to the positively biased electrode, and a collector, wherein the selectively biased electrode may selectively be negatively biased or positively biased.

18 Claims, 1 Drawing Sheet

ION BEAM MEASUREMENT APPARATUS AND METHOD

CROSS-REFERENCE TO RELATED APPLICATIONS

This application claims the benefit of U.S. Provisional Patent Application Ser. No. 60/653,394, filed Feb. 16, 2005, which is hereby incorporated by reference herein.

BACKGROUND OF THE INVENTION (1) Technical Field

The present invention relates generally to an apparatus and method useful in measuring properties of an ion beam and more particularly to an apparatus and method for performing functions of both a Faraday and an energy contamination monitor.

(2) Related Art

A Faraday Cup, or Faraday, measures an ion beam current by drawing an electron from ground for each positive ion that enters it. The Faraday's magnetic field prevents external secondary electrons from entering and prevents produced secondary electrons from exiting, thus enabling a measure of the current of the ion beam itself, free from the influence of extraneous charged particles.

An energy contamination monitor detects ions in a decelerated ion beam that have become neutral. Adjustment of an ion implanter in response to the detection of such ion beam neutrals permits their reduction or elimination before being implanted on a wafer. Energy contamination monitors are described more fully in co-pending U.S. Provisional Patent Application Ser. No. 60/544,029, which is hereby incorporated herein by reference.

Instrumentation in the end-station of an ion implanter is required to perform a variety of measurements, including the dose being applied to a wafer, the angular distribution of the ions within an ion beam, the density distribution of the ions within the ion beam as a whole, and the level of energy contamination in decelerated ion beams. To perform these measurements, an end-station typically includes both a Faraday and an energy contamination monitor, increasing both the physical hardware and expense of the end-station. Accordingly, there is a need in the art for an apparatus and method for performing a function of each of a Faraday and an energy contamination monitor, thus reducing both the hardware and expense of an ion implanter end-station.

SUMMARY OF THE INVENTION

The present invention provides a combined electrostatically suppressed Faraday and energy contamination monitor and related methods for its use. The apparatus of the present invention is capable of selectively measuring two properties of an ion beam, including, for example, a current and a level of energy contamination in a decelerated ion beam. A first aspect of the invention provides an ion beam measurement apparatus comprising an aperture for receiving the ion beam, a negatively biased electrode disposed adjacent to the aperture, a positively biased electrode disposed adjacent to the negatively biased electrode, a selectively biased electrode disposed adjacent to the positively biased electrode, and a collector, wherein the selectively biased electrode may selectively be negatively biased or positively biased.

A second aspect of the invention provides a method of selectively measuring one of a current and a level of energy contamination within an ion beam comprising the steps of providing an apparatus having an aperture for receiving the ion beam, a negatively biased electrode disposed adjacent to the aperture, a positively biased electrode disposed adjacent to the negatively biased electrode, a selectively biased electrode disposed adjacent to the positively biased electrode, wherein the selectively biased electrode may selectively be negatively biased and positively biased, and a collector, and selecting a negative bias for the selectively biased electrode to measure a current within the ion beam and a positive bias for the selectively biased electrode to measure a level of energy contamination within the ion beam.

A third aspect of the invention provides an ion beam measurement apparatus comprising an aperture for receiving the ion beam, a measuring device including a plurality of electrodes for selectively measuring one of a current and a level of energy contamination within the ion beam, and a collector.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
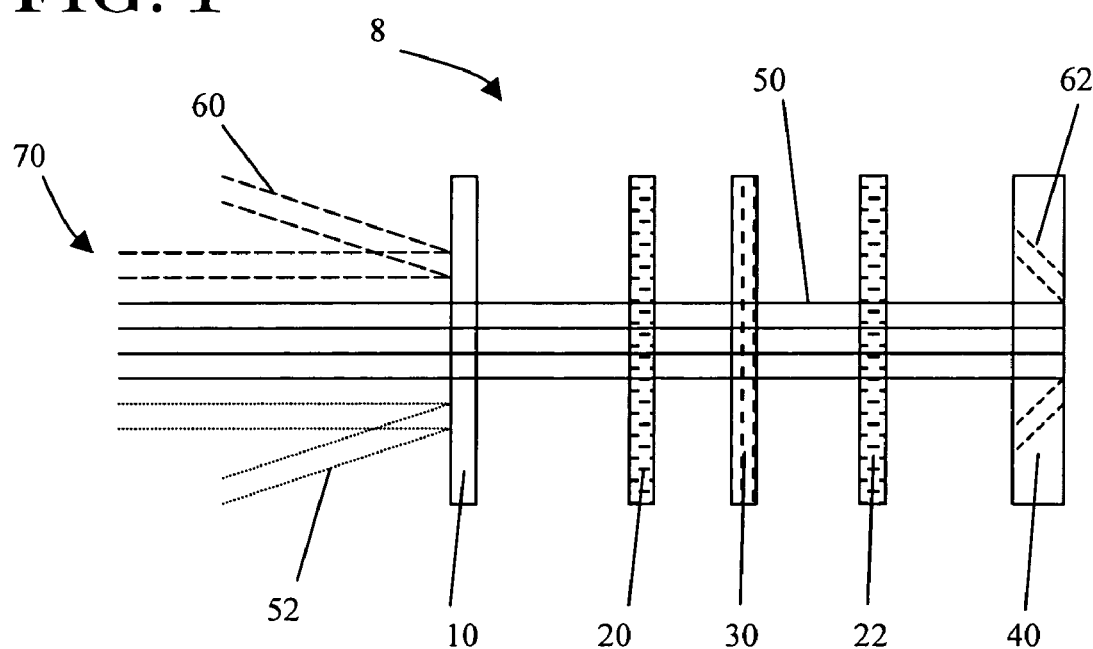
FIG. 1 shows an apparatus of the present invention in Faraday mode.

Referring to FIG. 1, apparatus 8 is configured in Faraday mode, wherein a positively biased electrode 30 is disposed between two negatively biased electrodes 20, 22. Together, electrodes 20, 22, 30 make a measuring device for measuring a current of the ion beam. Low energy electrons 60 are excluded from apparatus 8 by a first negatively biased electrode 20 and low energy ions 52 are excluded from apparatus 8 by positively biased electrode 30 while high energy ions 50 pass through aperture 10 and past each electrode 20, 30, 22 and strike collector 40. Low energy electrons 62 emitted from collector 40 are suppressed by a second negatively biased electrode 22 and retained in collector 40. In Faraday mode, apparatus 8 is capable of measuring a current of ion beam 70.

Figure 2:
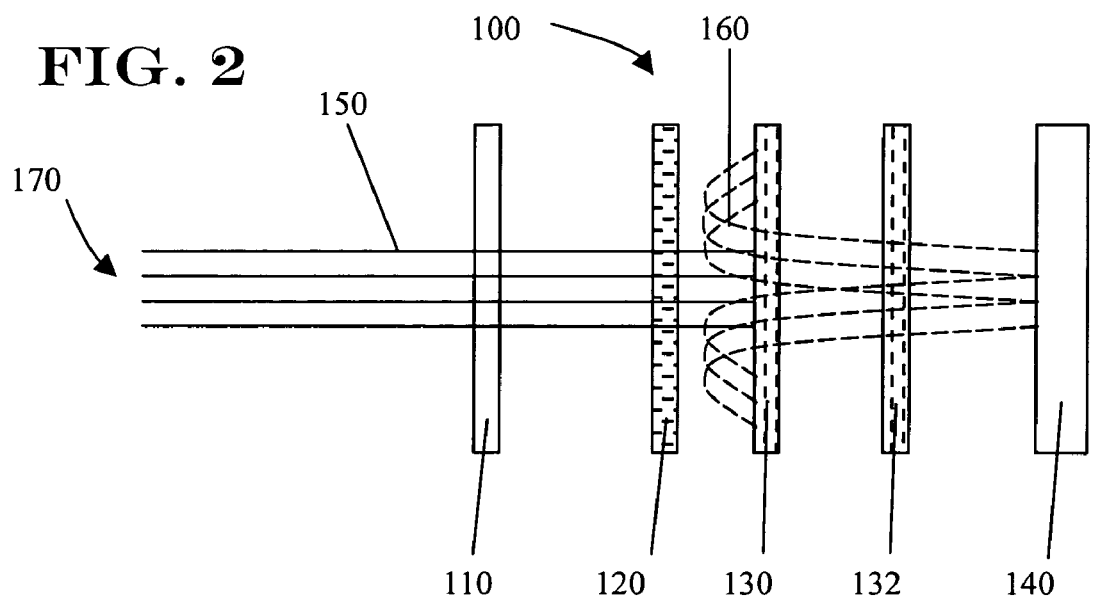
FIG. 2 shows an apparatus of the present invention in energy contamination monitor mode.

Altering the bias of second negatively biased electrode 22 results in the apparatus 100 of FIG. 2, operating in energy contamination monitor mode. In this mode, decelerated positive ions 150 are prevented from reaching collector 140 by the field provided by the positive potential applied to positively biased electrodes 130, 132 and electrons 160 released from collector 140 by neutral particles are collected by first and second positively biased electrodes 130, 132. Accordingly, in energy contamination monitor mode, apparatus 100 is capable of measuring the level of energy contamination within decelerated ion beam 170.

Thus, by selectively reversing the bias of one electrode, the apparatus of the present invention may be selectively operated in the Faraday mode of FIG. 1 and the energy contamination monitor mode of FIG. 2. As such, the electrodes of the present invention comprise a measuring device for selectively measuring one of a current and a level of energy contamination in an ion beam. Such an apparatus and method of operation may be used in place of two or more apparatuses currently known in the art. For example, the apparatus and method of the present invention may be used as a replacement for the angle measurement cups in the rear of a process chamber, including a VIIStaHC process chamber available from Varian Semiconductor Equipment Associates. In addition, the apparatus and method of the present invention may be used as the dose monitor cups and energy contamination monitors in such a chamber. Accordingly, the apparatus and method of the present invention fulfills three roles currently filled by separate apparatuses in the dose and quality control functions of high current machines.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An ion beam measurement apparatus comprising:
   an aperture for receiving an ion beam;
   a negatively biased electrode disposed adjacent to the aperture;
   a positively biased electrode disposed adjacent to the negatively biased electrode;
   a selectively biased electrode disposed adjacent to the positively biased electrode; and
   a collector,
   wherein the selectively biased electrode is either negatively biased or positively biased, wherein the apparatus measures a current of the ion beam if the selectively biased electrode is negatively biased.

2. The apparatus of claim 1, wherein a plurality of low energy electrons are substantially excluded from the apparatus by the negatively biased electrode.

3. The apparatus of claim 1, wherein a plurality of low energy ions are substantially excluded from the apparatus by the positively biased electrode.

4. The apparatus of claim 1, wherein a plurality of high energy ions strike the collector.

5. The apparatus of claim 1, wherein a plurality of low energy electrons emitted from the collector are substantially suppressed by the selectively biased electrode and retained in the collector.

6. The apparatus of claim 1, wherein the apparatus measures a level of energy contamination within the ion beam in the case that the selectively biased electrode is positively biased.

7. The apparatus of claim 6, wherein a plurality of decelerated positive ions are substantially prevented from reaching the collector by at least one of the positively biased electrode and the selectively biased electrode if the selectively biased electrode is positively biased.

8. The apparatus of claim 6, wherein a plurality of high energy neutral particles strike the collector if the selectively biased electrode is positively biased.

9. The apparatus of claim 6, wherein a plurality of electrons released from the collector are collected by at least one of the positively biased electrode and the selectively biased electrode if the selectively biased electrode is positively biased.

10. A method of selectively measuring one of a current and a level of energy contamination within an ion beam comprising:
    providing an apparatus having:
      an aperture for receiving the ion beam;
      a negatively biased electrode disposed adjacent to the aperture;
      a positively biased electrode disposed adjacent to the negatively biased electrode;
      a selectively biased electrode disposed adjacent to the positively biased electrode,
      wherein the selectively biased electrode is either negatively biased or positively biased; and
      a collector; and
    selecting a negative bias for the selectively biased electrode to measure a current within the ion beam and a positive bias for the selectively biased electrode to measure a level of energy contamination within the ion beam.

11. The method of claim 10, wherein, in the case that the selectively biased electrode is negatively biased, a plurality of low energy electrons are substantially excluded from the apparatus by the negatively biased electrode.

12. The method of claim 10, wherein, in the case that the selectively biased electrode is negatively biased, a plurality of low energy ions are substantially excluded from the apparatus by the positively biased electrode.

13. The method of claim 10, wherein, in the case that the selectively biased electrode is negatively biased, a plurality of high energy ions strike the collector.

14. The method of claim 10, wherein, in the case that the selectively biased electrode is negatively biased, a plurality of low energy electrons emitted from the collector are substantially suppressed by the selectively biased electrode and retained in the collector.

15. The method of claim 10, wherein, in the case that the selectively biased electrode is positively biased, a plurality of decelerated positive ions are substantially prevented from reaching the collector by at least one of the positively biased electrode and the selectively biased electrode.

16. The method of claim 10, wherein, in the case that the selectively biased electrode is positively biased, a plurality of high-energy neutral particles strike the collector.

17. The method of claim 10, wherein, in the case that the selectively biased electrode is positively biased, a plurality of electrons released from the collector are collected by at least one of the positively biased electrode and the selectively biased electrode.

18. An ion beam measurement apparatus comprising:
    an aperture for receiving an ion beam;
    a measuring device for selectively measuring one of a current and a level of energy contamination within the ion beam, wherein the measuring device comprises a selectively biased electrode that is either negatively biased or positively biased, wherein the apparatus measures said current if the selectively biased electrode is negatively biased; and
    a collector.

* * * * *